United States Patent [19]

Shipe

[11] Patent Number: 5,700,724
[45] Date of Patent: Dec. 23, 1997

[54] HERMETICALLY SEALED PACKAGE FOR A HIGH POWER HYBRID CIRCUIT

[75] Inventor: Gary Shipe, Cambridge, Md.

[73] Assignee: Philips Electronic North America Corporation, New York, N.Y.

[21] Appl. No.: 284,965

[22] Filed: Aug. 2, 1994

[51] Int. Cl.$^6$ .................................................. H01L 21/60
[52] U.S. Cl. .................. 437/215; 437/221; 257/698; 257/700
[58] Field of Search ................. 437/215, 221; 257/692, 698, 700, 747; 228/121, 124.1, 124.5, 56.3; 29/841

[56] References Cited

U.S. PATENT DOCUMENTS

| | | | |
|---|---|---|---|
| 3,388,302 | 6/1968 | McManus | 257/692 |
| 3,867,184 | 2/1975 | Baldi et al. | 29/199 |
| 3,941,299 | 3/1976 | Godfrey . | |
| 4,011,056 | 3/1977 | Steine et al. | 29/199 |
| 4,451,540 | 5/1984 | Baird et al. | 428/615 |
| 4,563,541 | 1/1986 | Lebailly et al. | 420/558 |
| 4,649,229 | 3/1987 | Scherer et al. . | |
| 4,855,808 | 8/1989 | Tower et al. | 257/698 |
| 4,975,762 | 12/1990 | Stradley et al. | 357/74 |
| 5,033,666 | 7/1991 | Keusseyan et al. | 228/121 |
| 5,086,333 | 2/1992 | Osada et al. | 357/67 |
| 5,481,136 | 1/1996 | Kohmoto et al. | 257/747 |

FOREIGN PATENT DOCUMENTS

| | | |
|---|---|---|
| 3285348 | 3/1990 | Japan . |
| 2129946 | 5/1990 | Japan . |
| 3285347 | 12/1991 | Japan . |
| 4179254 | 6/1992 | Japan . |

OTHER PUBLICATIONS

"Standard Specification for Steel Bars, Carbon Cold Finished, Standard Quality", pp. 18–21, ASTM Designation: A 108–90a (Sep. 1990).

"The Use of Multilayer Ceramic Inserts for Total Mitigation of the Cracked Bead Problem" By J. Carter; Hybrid Circuit Technology, Oct. 1990, pp. 43–46.

*Primary Examiner*—John Niebling
*Assistant Examiner*—Kevin F. Turner
*Attorney, Agent, or Firm*—Steven R. Biren

[57] ABSTRACT

A metal ring frame, having co-fired ceramic inserts, is hermetically sealed to a copper/molybdenum base using a brazing alloy having a melting temperature which is approximately the cross-over temperature for the TCE curves of the base and ring frame. Preferably the base contains at least 20% copper by weight. The brazing alloy is a silver/copper alloy such as 56% Ag, 22% Cu, 17% Zn and 5% Sn, or one with a higher brazing temperature such as 78/22 Ag/Cu, and is used for brazing both the inserts into the frame and the frame onto the base.

10 Claims, 2 Drawing Sheets

HERMETICALLY SEALED PACKAGE FOR A HIGH POWER HYBRID CIRCUIT

BACKGROUND OF THE INVENTION

1. Field of the Invention

The invention relates to hermetically sealed electronics packages; and more particularly to such packages for circuits dissipating considerable heat, and having many lead connections passing through the package.

The invention is applicable to the manufacture of a partial package, ready for installation of an electrical element or integrated circuit into the partial package, and then sealing of a lid. Such packages are available with feedthrough inserts already sealed into a ring frame which is also already sealed to a base.

2. Description of the Prior Art

Glass to metal feedthrough seals, in which a metal wire passes through a small hole in a metal envelope and the hole is sealed with glass, were introduced commercially more than half a century ago. Loss of hermeticity due to cracks in the glass led to recognition of the importance of controlling the temperature coefficient of expansion (TCE) of the glass, the feedthrough wire or pin, and the frame or container. A major improvement was the introduction of low TCE alloys, specified for example in Military Specification MIL-I-23011C (27 Mar. 1974), and especially the "Class 1" alloy listed therein containing 29% Ni, 17% Co and 54% Fe, commonly sold under the trademark Kovar, for at least the portion of the package through which the leads passed. Many different glass formulations were developed, to provide sufficient wetting so that a good bond is obtained, without producing such a long fillet along the wire that ordinary amounts of flexure would cause some of the glass to fracture.

Over the years, the increase in the size and complexity of integrated circuits has led to need for a very large number of connections to pass through the sides of the package. This led to the development of the ring frame as a separate element, usually made of Kovar, which formed the side walls of a low height container. The holes for the seals are made in the ring frame, and the seals are then formed in place. This assembly was then brazed to the case base before the electrical circuits were installed and connected to the seal lead wires. As the number of circuit connections continued to grow, the conventional, individual pin seal geometry prevented reducing the pin-to-pin spacing below a minimum value, thereby limiting the pin density.

At the same time, the individual seal reliability has become more important, because one seal failure in a 100 seal package is just as fatal as one in a three lead package. To provide increased pin density and still higher reliability in a low profile package, multi-layer ceramic inserts have been developed as a replacement for pin-type seals. Such inserts are typically rectangular in cross-section, and have one or more flat feedthrough conductors on a ceramic substrate, covered with an insulating layer. However, the ceramic inserts cannot be formed in place in a metal package, and depend on brazing to the case or a ring frame for mechanical stability and hermetic sealing. The temperature at which brazing is performed can be critical, so that differences in the coefficients of expansion between the package base or ring frame and the inserts do not cause seal cracking during cooling or subsequent testing and use. This led to use of low temperature brazing alloys, such as gold-germanium having a melting point of 356° C., but this has proved a difficult material to work with on a production basis. To resolve the hermeticity and braze flow problem, a 72/28 Ag/Cu braze has been tried, but the TCE mismatch between the Kovar ring frame and heat sink materials used for the base caused excessive warping of the package.

When relative large flat packages are desired, maintaining adequate flatness of the base has become increasingly critical because of warping which occurs during and after brazing. At the same time, it has become desirable to increase the thermal conductivity of the base. This added one more level of difficulty to the question of material selection.

SUMMARY OF THE INVENTION

According to the invention, an improved package includes a copper-molybdenum alloy base, a ring frame, and feedthrough inserts sealed into the frame, the frame and base being brazed together using a composition having a brazing temperature approximately at or above the cross-over temperature for the TCE of the base and frame materials. This may be, for example, an intermediate brazing temperature between 550° and 700° C., or a higher brazing temperature such as approximately 780° C.

In one preferred embodiment, the base material is a composite material containing approximately 20% copper, and the balance molybdenum. This base material has a thermal conductivity of 175 W/mK, which is more than 8 times that of a low TCE material such as 29% Ni, 17% Co, 54% Fe alloy (Kovar); and a TCE of $7.1\times10^{-6}/°C$. which is only slightly greater than that of alumina. The ring frame is made from Kovar, and the brazing material is an alloy of 56% Ag, 22% Cu, 17% Zn and 5% Sn, having a brazing temperature of approximately 620° C.

In this preferred embodiment, the inserts are made primarily of alumina and are brazed into notches in the frame using the same material as the frame-base braze. Preferably, the frame notches are open toward a ring of braze material placed between the base and frame, so that both brazing steps take place at the same time. According to this aspect of the invention, because the brazing temperature is relatively high, it is slightly above the cross-over points of the TCE curves of Kovar, alumina and the copper/molybdenum base material. This results in some compressive stress being applied to the alumina inserts, thereby augmenting the hermetic seal yet enabling the finished package flatness to be approximately 0.001" per inch.

According to another preferred embodiment of the invention, the base material is a copper/molybdenum material containing approximately 36% copper which has an even higher thermal conductivity than 80/20 Mo/Cu; the ring frame is made from Kovar; and the braze material is one selected to have a brazing temperature of approximately 780° C., such as 72/28 Ag/Cu.

According to yet another embodiment of the invention, the ring frame is made from a metal other than Kovar, having a TCE curve which crosses the TCE curve of a copper/molybdenum alloy at a temperature between 500° C. and approximately 800° C. for which an easy brazing material is available. The ring frame expansion coefficient at the brazing temperature should be slightly above the expansion coefficient of the insert material. The base is made from that copper/molybdenum alloy whose expansion coefficient matches the ring frame at the desired brazing temperature.

According to this embodiment, the brazing material is preferably 72/28 Ag/Cu, and the brazing temperature is at least 780° C. When the ring frame is made from a material such as cold rolled steel, having a TCE of approximately 10.6×10⁻⁶/°C., the base material may preferably be a copper/molybdenum material containing more than approximately 36% copper, such as 60/40 Mo/Cu. Such a construction minimizes material costs while providing very high heat transfer through the base.

DESCRIPTION OF THE PREFERRED EMBODIMENT

Figure 1:
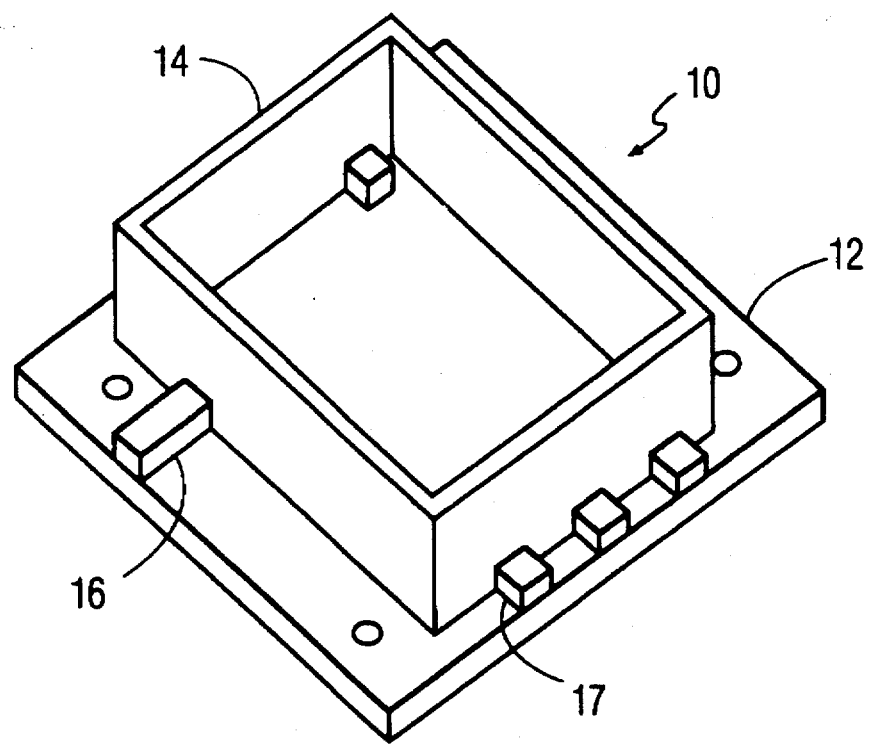
FIG. 1 is a perspective view of a base and frame assembly after brazing.

The base and frame assembly 10 shown in FIG. 1 is made from a base 12 to which a frame 14 has been brazed. One long and four short feedthrough alumina ceramic inserts 16 and 17 can be seen.

Figure 2:
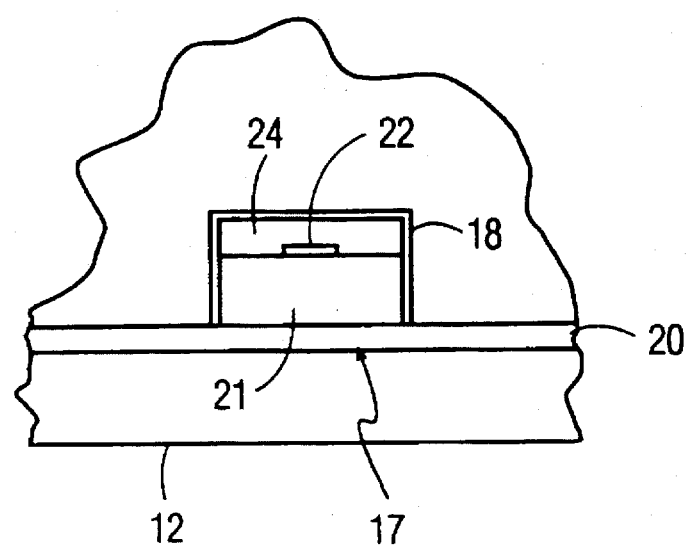
FIG. 2 is a side view at an enlarged scale, showing a portion of the base and frame prior to brazing.
Figure 3:
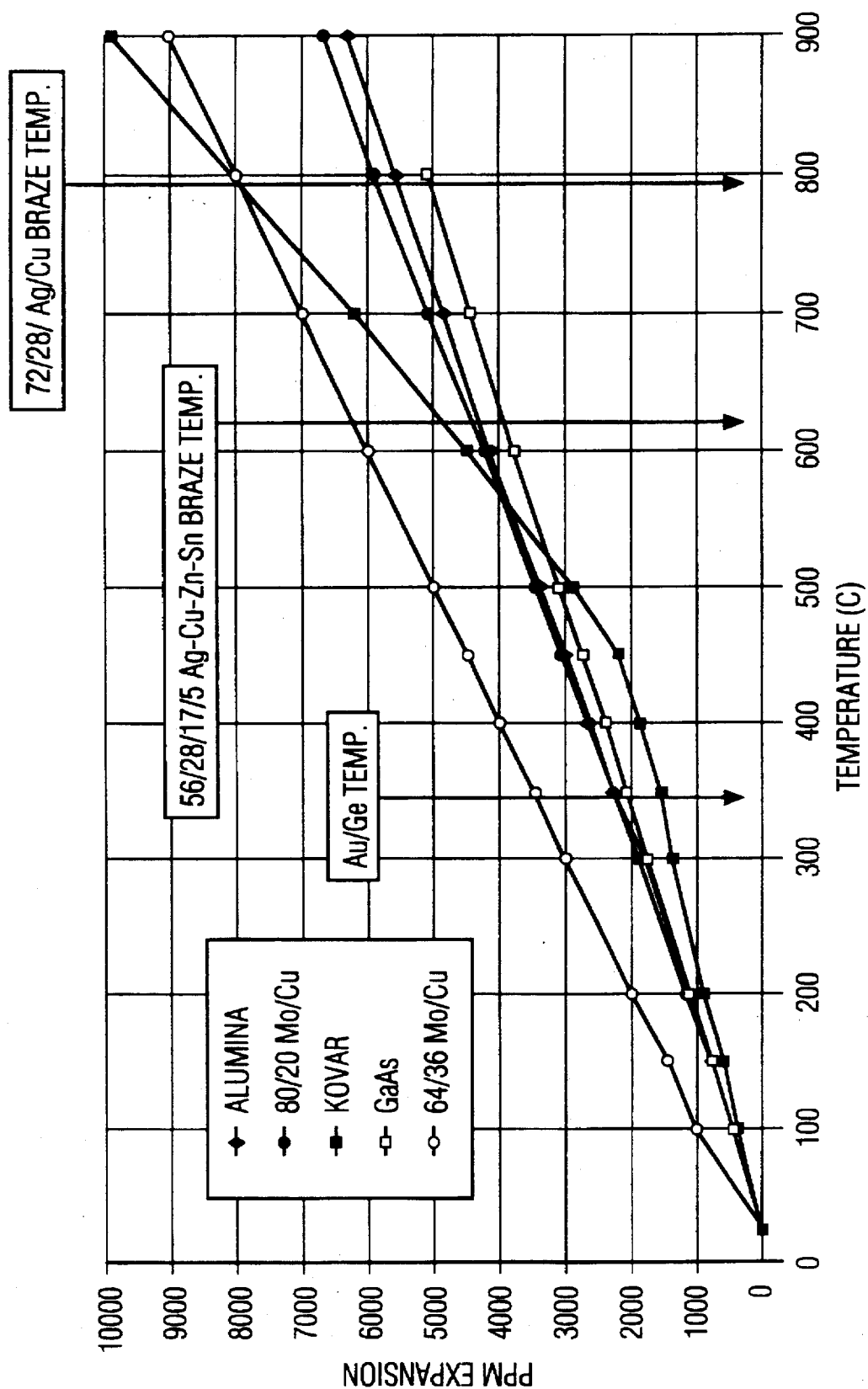
FIG. 3 is a graph of the TCE values for alumina, Kovar, 80/20 Mo/Cu and 64/36 Mo/Cu.

In the enlarged view of FIG. 2, a portion of the base 12, frame 14 and one insert 17 are shown. The base 12 is made using powder metallurgy techniques, to provide a uniform distribution of 20% copper in molybdenum. The frame 14 is made from the well-known alloy 54% Fe, 29% Ni and 17% Co sold under the tradename Kovar. A notch 18 is formed in the lower edge of the frame 14 to receive the insert 17. A braze preform 20, shown with exaggerated thickness, is formed from a 56% Ag, 22% Cu, 17% Zn, 5% Sn alloy sold commercially as Indalloy #217. The insert 17 includes an alumina substrate 21 on which at least one narrow conducting layer 22 is formed by tungsten or molybdenum/manganese metallizing. The portion of the insert 17 which will be within the notch 17 includes a layer 24 of alumina covering the substrate 21 and layer 22 to provide electrical insulation and hermetic sealing. The gap between the insert 17 and the frame 14 will fill with braze alloy drawn by capillary action from the preform 20 to form a hermetic seal.

Preferably, prior to brazing, the parts may be pre-plated with nickel, followed possibly by copper or gold.

To form the assembly 10, the parts are arranged as shown, in a graphite fixture which is weighted to assist settling of the components during brazing, and are placed in a brazing furnace in which an atmosphere of nitrogen and hydrogen is established. The temperature is raised to approximately 700° C., for example for 5 to 7 minutes, thereby achieving a brazing temperature of approximately 650° C. The furnace is then cooled, for example using a chilled water jacket around a cooling portion of the furnace before removal of the brazed assembly.

When brazed according to this method, part flatness better than 0.002" per inch is obtained, comparable to flatness of Au/Ge brazed parts but without braze flow and hermeticity problems.

In some applications an even higher thermal conductivity may be desired for the completed package. Through the use of powder metallurgy, composite materials are now available having much higher copper content. Even though the match of the TCE of the base to the TCE of the substrate of an integrated circuit which is to be mounted on the base, may not be as good as the match obtained with a base containing 20% copper, a higher copper content, such as 36%, may be desirable in some applications. For brazing to such a base, a 72/28 eutectic Ag/Cu braze, which melts at 780° C., matches the brazing temperature to the cross-over of the TCE for 64/36 Mo/Cu alloy and Kovar. For these materials, a furnace temperature higher than 800° C. will be desirable.

In one embodiment where base composition is selected to match the ring frame material, the base material is a cold-rolled steel of C1010-C1018 composition in accordance with ASTM standard specification A108, Table 1. The thermal expansion coefficient of this material across the range of 25° C. to 800° C. is approximately 10.6×10⁻⁶/°C. This expansion coefficient is matched approximately by 60/40 Mo/Cu, so that brazing with 72/28 Ag/Cu braze provides a good thermal match, enabling a brazed package to maintain flatness.

Steel compositions of these types are generally used in order to take advantage of low material cost, because plating of the material on exposed surfaces with a corrosion resistant material can usually overcome any corrosion problems. Stainless steels could conceivably be used in this configuration, but brazing of these is much more difficult and is restricted to certain filler materials.

ALTERNATIVE EMBODIMENTS

Those of ordinary skill in the brazing and heat treating art will recognize that many variations can be made within the spirit of the invention.

To increase the production rate, other brazing techniques may be used. For example, it may be feasible to move the parts through heating and cooling zones in a furnace. It is merely necessary that oxidation of the parts, while still at elevated temperatures, be prevented.

Other types of feedthrough insert may be developed, having a different cross-section or fabricated from different materials, or adapted for fitting differently into a ring frame. Other braze materials may be discovered, which provide good wetting to the insert, frame and base materials, and have brazing temperatures that match the cross-over of the TCE curves of the base and frame materials. Accordingly the scope of the invention should be measured by the appended claims.

What is claimed is:

1. A method of hermetically sealing a ring frame with inserts to a base, comprising:

selecting a metal ring frame material having a given expansion coefficient at a given temperature, selecting a brazing alloy having a brazing temperature equal to approximately said given temperature, selecting a copper/molybdenum alloy having an expansion coefficient at said given temperature approximately equal to said given expansion coefficient, providing a base made of said copper/molybdenum alloy, and having a top surface, providing a ring frame made of said metal ring frame material, having a given plurality of insert openings formed therein along an edge of said ring frame which is sealed to said base, providing a number of inserts equal to said given plurality, each insert being a respective multi-layer ceramic insert for providing electrical connection from outside said frame to inside said frame, hermetically sealing each insert in a respective one of said insert openings, and, at substantially the same time, hermetically sealing said ring frame to said top surface of said base by brazing with said brazing alloy at a temperature at least equal to said given temperature.

2. A method as claimed in claim 1, characterized in that the step of hermetically sealing each insert is performed simultaneously with the step of hermetically sealing said ring frame, and uses said brazing alloy.

3. A method as claimed in claim 1, characterized in that said brazing alloy is an alloy consisting essentially of 56% Ag, 22% Cu, 17% Zn and 5% Sn, and the sealing steps comprise:

providing a braze preform made of said alloy, placing said preform between and in contact with said frame and said base, and heating said frame, base and preform in a brazing furnace having a furnace temperature of approximately 670° C.

4. A method as claimed in claim 3, characterized in that said copper/molybdenum alloy consists essentially of molybdenum and approximately 20% by weight of copper, and said metal ring frame material consists essentially of approximately 54% Fe, 29% Ni, and 17% Co by weight.

5. A method as claimed in claim 1, characterized in that said openings in said ring frame are notches formed in an edge of the ring frame which is sealed to said top surface, and the step of hermetically sealing said inserts to said ring frame comprises brazing with said brazing alloy.

6. A method as claimed in claim 5, characterized in that said copper/molybdenum alloy consists essentially of molybdenum and at least approximately 20% by weight of copper, and said metal ring frame material consists essentially of approximately 54% Fe, 29% Ni, and 17% Co by weight.

7. A method as claimed in claim 6, characterized in that brazing alloy is an alloy consisting essentially of 56% Ag, 22% Cu, 17% Zn and 5% Sn, and the sealing steps comprise:

providing a braze preform made of said alloy, placing said preform between and in contact with said frame and said base, and heating said frame, base and preform in a brazing furnace having a furnace temperature of approximately 670° C.

8. A method as claimed in claim 1, characterized in that said copper/molybdenum alloy comprises at least approximately 36% copper by weight, and said brazing alloy has a brazing temperature of at least approximately 780° C.

9. A method as claimed in claim 8, characterized in that said metal ring frame material consists essentially of approximately 54% Fe, 29% Ni, and 17% Co by weight.

10. A method as claimed in claim 8, characterized in that brazing alloy is an alloy consisting essentially of 72% Ag and 28% Cu, and the sealing steps comprise:

providing a braze preform made of said alloy, placing said preform between and in contact with said frame and said base, and heating said frame, base and preform in a brazing furnace having a furnace temperature greater than approximately 800° C.

* * * * *